US010036396B2

(12) United States Patent
Kangas et al.

(10) Patent No.: US 10,036,396 B2
(45) Date of Patent: Jul. 31, 2018

(54) FIELD CONFIGURABLE FAN OPERATIONAL PROFILES

(71) Applicant: CORIANT OPERATIONS, INC., Naperville, IL (US)

(72) Inventors: Bradley R. Kangas, Saint Charles, IL (US); David J. Womac, Saint Charles, IL (US)

(73) Assignee: Coriant Operations, Inc., Naperville, IL (US)

( * ) Notice: Subject to any disclaimer, the term of this patent is extended or adjusted under 35 U.S.C. 154(b) by 399 days.

(21) Appl. No.: 13/791,389

(22) Filed: Mar. 8, 2013

(65) Prior Publication Data

US 2014/0255146 A1    Sep. 11, 2014

(51) Int. Cl.
*F04D 27/00* (2006.01)
*F04D 25/16* (2006.01)

(52) U.S. Cl.
CPC ......... *F04D 27/004* (2013.01); *F04D 25/166* (2013.01)

(58) Field of Classification Search
CPC .. H03K 17/962; H03K 17/945; H03K 17/955; H03K 17/9645; H05B 39/085; F04D 25/166; F04D 27/004; G06F 1/20; G06F 1/203; G06F 1/206; G06F 1/181; G06F 1/183; H01L 23/467; H05K 7/20172; H05K 7/20727
USPC .............................. 307/116; 361/695, 679.48
See application file for complete search history.

(56) References Cited

U.S. PATENT DOCUMENTS

| 3,494,575 A | | 2/1970 | Budworth |
|---|---|---|---|
| 4,903,338 A | | 2/1990 | Funke |
| 5,099,181 A | | 3/1992 | Canon |
| 5,293,103 A | * | 3/1994 | Hanna ...................... H02P 7/18 318/268 |
| 5,500,756 A | | 3/1996 | Tsushima et al. |
| 5,709,100 A | | 1/1998 | Baer et al. |
| 5,806,948 A | | 9/1998 | Rowan, Sr. et al. |
| 5,821,596 A | * | 10/1998 | Miu ...................... G01L 9/0051 257/419 |

(Continued)

FOREIGN PATENT DOCUMENTS

| CN | 202718897 U | 2/2013 |
|---|---|---|
| EP | 1 202 595 A1 | 5/2002 |

(Continued)

OTHER PUBLICATIONS

"Network Equipment—Environmental Criteria", Telecordia Technologies, Inc., General Requirements Doc. No. 63—CORE, Issue 4, Apr. 2012, pp. 4-1 to 4-13.

(Continued)

*Primary Examiner* — Thienvu Tran
*Assistant Examiner* — Brian K Baxter
(74) *Attorney, Agent, or Firm* — Merchant & Gould P.C.

(57) ABSTRACT

A system, apparatus, and procedure for controlling a fan module. The system comprises a chassis having a backplane, at least one fan module arranged in the chassis, and a profile switch. In one embodiment, the profile switch is arranged in the chassis. Each fan module includes at least one fan and a fan module controller arranged to receive a control signal from a shelf controller. The profile switch is arranged to signal the fan module controller so as to control the at least one fan based on operating profiles corresponding to selected switch positions of the switch.

25 Claims, 4 Drawing Sheets

(56) References Cited

U.S. PATENT DOCUMENTS

| | | | |
|---|---|---|---|
| 5,864,414 A | 1/1999 | Barnsley et al. | |
| 5,940,197 A | 8/1999 | Ryu | |
| 6,031,717 A * | 2/2000 | Baddour | G06F 1/20 361/679.48 |
| 6,127,663 A | 10/2000 | Jones | |
| 6,268,664 B1 | 7/2001 | Rolls | |
| 6,466,348 B1 | 10/2002 | Izumi | |
| 6,525,852 B1 | 2/2003 | Egnell | |
| 6,535,309 B1 | 3/2003 | Terahara | |
| 6,594,046 B1 | 7/2003 | Nishino | |
| 6,606,427 B1 | 8/2003 | Graves et al. | |
| 6,606,578 B1 | 8/2003 | Henderson et al. | |
| 6,648,115 B2 | 11/2003 | Smith et al. | |
| 6,822,860 B2 | 11/2004 | Owens et al. | |
| 6,861,943 B2 * | 3/2005 | Pike | G06F 1/20 340/3.9 |
| 6,868,201 B1 | 3/2005 | Johnson et al. | |
| 6,889,609 B2 | 5/2005 | Braun et al. | |
| 6,912,129 B2 | 6/2005 | Baker et al. | |
| 6,980,783 B2 | 12/2005 | Yan-Fei | |
| 6,992,723 B1 | 1/2006 | Wulf et al. | |
| 6,999,677 B2 | 2/2006 | Graves et al. | |
| 7,133,616 B2 | 11/2006 | Caroli | |
| 7,155,124 B2 | 12/2006 | Peddanarappagari et al. | |
| 7,184,666 B1 | 2/2007 | Li et al. | |
| 7,209,351 B2 | 4/2007 | Wei | |
| 7,231,107 B1 | 6/2007 | Zhong et al. | |
| 7,236,704 B1 | 6/2007 | Cao | |
| 7,272,321 B1 | 9/2007 | Kuo et al. | |
| 7,292,786 B1 | 11/2007 | Barbarossa et al. | |
| 7,337,018 B2 | 2/2008 | Espinoza-Ibarra et al. | |
| 7,343,066 B2 | 3/2008 | Doerr et al. | |
| 7,430,117 B2 | 9/2008 | Shabany | |
| 7,434,171 B2 | 10/2008 | Clapper | |
| 7,558,284 B2 | 7/2009 | Shinomiya et al. | |
| 7,630,634 B1 | 12/2009 | Boduch | |
| 7,653,311 B2 | 1/2010 | Kikuchi et al. | |
| 7,675,747 B1 * | 3/2010 | Ong | F04D 19/024 361/679.46 |
| 7,751,714 B2 | 7/2010 | Zhong et al. | |
| 7,781,714 B2 | 8/2010 | Lee et al. | |
| 7,797,080 B2 | 9/2010 | Durham, III | |
| 7,983,560 B2 | 7/2011 | Maki et al. | |
| 8,089,683 B2 | 1/2012 | Holmes | |
| 8,116,629 B2 | 2/2012 | Boduch et al. | |
| 8,180,495 B1 | 5/2012 | Roy | |
| 8,190,027 B2 | 5/2012 | Boduch et al. | |
| 8,320,759 B2 | 11/2012 | Boduch | |
| 8,428,461 B2 | 4/2013 | Boduch et al. | |
| 8,447,183 B2 | 5/2013 | Boduch et al. | |
| 8,509,618 B2 | 8/2013 | Boertjes et al. | |
| 8,565,603 B2 | 10/2013 | Boduch et al. | |
| 8,737,776 B2 | 5/2014 | Boduch | |
| 8,995,832 B2 | 3/2015 | Ji et al. | |
| 9,008,514 B2 | 4/2015 | Boduch et al. | |
| 9,252,910 B2 | 2/2016 | Roorda | |
| 9,276,695 B2 | 3/2016 | Boduch et al. | |
| 9,374,186 B1 | 6/2016 | Boduch et al. | |
| 9,551,836 B2 | 1/2017 | Frankel et al. | |
| 2001/0030797 A1 | 10/2001 | Kosaka et al. | |
| 2002/0021862 A1 | 2/2002 | Zhou et al. | |
| 2002/0057477 A1 | 5/2002 | Rocca et al. | |
| 2002/0080440 A1 | 6/2002 | Li et al. | |
| 2002/0093707 A1 | 7/2002 | Katagiri et al. | |
| 2002/0094282 A1 * | 7/2002 | Bendikas | F04D 25/166 417/360 |
| 2002/0097469 A1 | 7/2002 | Yee et al. | |
| 2002/0101636 A1 | 8/2002 | Xiao et al. | |
| 2002/0145779 A1 | 10/2002 | Strasser et al. | |
| 2002/0186432 A1 | 12/2002 | Roorda et al. | |
| 2003/0002104 A1 | 1/2003 | Caroli et al. | |
| 2003/0007209 A1 | 1/2003 | Liu et al. | |
| 2003/0031452 A1 | 2/2003 | Simmons et al. | |
| 2003/0050713 A1 * | 3/2003 | Piersanti et al. | 700/1 |
| 2003/0058080 A1 * | 3/2003 | Pike | G06F 1/20 340/3.9 |
| 2003/0058618 A1 * | 3/2003 | Soetemans et al. | 361/688 |
| 2003/0058847 A1 * | 3/2003 | Pike | H04L 49/351 370/360 |
| 2003/0059031 A1 * | 3/2003 | Pike | H04M 3/005 379/325 |
| 2003/0179741 A1 | 9/2003 | Goergen | |
| 2004/0028407 A1 | 2/2004 | Noheji | |
| 2004/0033079 A1 | 2/2004 | Sheth et al. | |
| 2004/0042712 A1 | 3/2004 | Cho et al. | |
| 2004/0042795 A1 | 3/2004 | Doerr et al. | |
| 2004/0076438 A1 | 4/2004 | Lee | |
| 2004/0175179 A1 | 9/2004 | Xiao et al. | |
| 2004/0184809 A1 | 9/2004 | Miyata et al. | |
| 2004/0190901 A1 | 9/2004 | Fang | |
| 2004/0247239 A1 | 12/2004 | Eldada | |
| 2004/0253918 A1 | 12/2004 | Ezell et al. | |
| 2004/0258226 A1 | 12/2004 | Host | |
| 2005/0047795 A1 | 3/2005 | Windover et al. | |
| 2005/0078461 A1 | 4/2005 | Dobbs et al. | |
| 2005/0106046 A1 | 5/2005 | Winkler | |
| 2005/0204125 A1 * | 9/2005 | Chin | 713/100 |
| 2005/0241810 A1 | 11/2005 | Malone et al. | |
| 2005/0259395 A1 | 11/2005 | Espinoza-Ibarra et al. | |
| 2005/0281558 A1 | 12/2005 | Wang et al. | |
| 2006/0034610 A1 | 2/2006 | Akiyama et al. | |
| 2006/0133804 A1 | 6/2006 | Boduch et al. | |
| 2006/0133807 A1 | 6/2006 | Jenkins et al. | |
| 2006/0172685 A1 | 8/2006 | O'Brien | |
| 2006/0176667 A1 * | 8/2006 | Chen | G06F 1/20 361/695 |
| 2006/0177225 A1 | 8/2006 | Paraschis et al. | |
| 2006/0197394 A1 | 9/2006 | Applegate | |
| 2007/0034739 A1 | 2/2007 | Yoeli | |
| 2007/0075663 A1 * | 4/2007 | Tien | 318/268 |
| 2007/0112939 A1 | 5/2007 | Wilson et al. | |
| 2007/0143689 A1 * | 6/2007 | Houston | 715/747 |
| 2007/0174020 A1 * | 7/2007 | Lanus | 702/182 |
| 2007/0187990 A1 * | 8/2007 | Shahbazi | 296/180.1 |
| 2007/0192486 A1 | 8/2007 | Wilson et al. | |
| 2007/0237524 A1 | 10/2007 | Gerstel et al. | |
| 2007/0297893 A1 * | 12/2007 | Alon | F04D 25/166 415/47 |
| 2008/0008474 A1 | 1/2008 | Boduch et al. | |
| 2008/0013953 A1 | 1/2008 | Boduch et al. | |
| 2008/0013954 A1 | 1/2008 | Boduch et al. | |
| 2008/0233858 A1 | 9/2008 | Womac et al. | |
| 2008/0260386 A1 | 10/2008 | Boduch et al. | |
| 2008/0267631 A1 | 10/2008 | Collings et al. | |
| 2009/0148166 A1 | 6/2009 | Akiyama et al. | |
| 2009/0232497 A1 | 9/2009 | Archambault et al. | |
| 2009/0242186 A1 * | 10/2009 | Koshiyama | G05D 23/1931 165/288 |
| 2010/0042562 A1 * | 2/2010 | Mace et al. | 706/12 |
| 2010/0124391 A1 | 5/2010 | Feuer et al. | |
| 2011/0076016 A1 | 3/2011 | Wisseman | |
| 2012/0086203 A1 | 4/2012 | Agtuca | |
| 2012/0293934 A1 * | 11/2012 | Boduch et al. | 361/679.2 |
| 2012/0328239 A1 | 12/2012 | Fuerst et al. | |
| 2013/0108215 A1 | 5/2013 | Ticknor et al. | |
| 2013/0195449 A1 | 8/2013 | Ghioni et al. | |
| 2015/0208146 A1 | 7/2015 | Younce et al. | |

FOREIGN PATENT DOCUMENTS

| | | |
|---|---|---|
| EP | 1 434 374 A1 | 6/2004 |
| EP | 1 498 568 A1 | 1/2005 |
| EP | 1 628 424 A2 | 2/2006 |
| WO | 03/061330 A2 | 7/2003 |
| WO | 2008/008277 A2 | 1/2008 |

OTHER PUBLICATIONS

"Operating Temperature and Humidity Criteria", Telecordia Technologies, Inc., General Requirements Doc. No. 3160—CORE, Issue 1, Nov. 2008, pp. 3-8 to 3-12.

(56) References Cited

OTHER PUBLICATIONS

Earnshaw, M.P. et al., "Planar Lightwave Circuit Based Reconfigurable Optical Add-Drop Multiplexer Architectures and Reusable Subsystem Module," IEEE Journal of Selected Topics in Quantum Electronics, vol. 11, No. 2, pp. 313-322 (Mar./Apr. 2005).
European Office Action dated Nov. 29, 2010 in European Application No. 07 796 705.7-2415.
European Office Action dated May 3, 2011, in counterpart European Application No. 07 796 705.7-2415.
Jajszczyk, A. et al., "An Architecture for a Photonic Fast Packed Switching Fabric," Proceedings of the Global Telecommunications Conference (Globecom), New York, pp. 1219-1223 (Dec. 2, 1991).
Lei Zong et al., "A Novel Tunable DeMUX/MUX Solution for WSS-Based ROADM and WXC Nodes," Optical Fiber Communication Conference and Exposition National Fiber Optic Engineers Conference, OFCNFOEC 2007 25-29, Mar. 25-29, 2007, pp. 1-7.
PCT International Search Report and Written Opinion of International Search Authority in PCT/US2007/015541 dated Jun. 5, 2008.

* cited by examiner

FIELD CONFIGURABLE FAN OPERATIONAL PROFILES

BACKGROUND

Field

Example embodiments described herein relate generally to fan control arrangements for rack-mountable electronic equipment and, more particularly, to a profile switch that sets an operational profile for the control of a fan module.

Description of Related Art

Modular electronic equipment is typically arranged in chassis which are, in turn, installed in racks or cabinets. Generally, a telecommunications rack has vertical supports and is open on both sides, whereas a data center cabinet has sides and a back which are generally closed. Each rack or cabinet typically has an opening to receive the chassis. Such openings are typically one of a plurality of standard sizes, such as 23 inches, 19 inches, and 500 millimeters. Data center cabinets generally have a width of 19 inches, while telecommunications racks generally have a width of 23 inches.

One example of a representative chassis is each chassis 102 of the two rack-mountable-chassis (upper and lower) shown in FIG. 1, which is also shown as chassis 1800 in FIG. 1 of U.S. patent application Ser. No. 12/036,029.

The electronic components in the chassis generate heat which is typically removed by cooling fans in chassis. Such fans direct air across the electronic components to remove heat produced therefrom. For example, in one example aspect of the invention in the '029 application, the chassis is configured with forced air cooling provided by one or more fans, such as a fan (not shown) in a compartment 1826 of FIG. 1, and the like. The fan may be positioned and configured to provide forced air movement through the chassis 1800 in a direction from a second lateral surface 1806 to a first lateral surface 1814, or vice versa. The more open configuration of telecommunication racks provides less restriction to air flow, as compared to the closed cabinet configurations found in data centers, which can severely restrict air flow to the chassis. Also, the rack width itself can have an impact on air flow. In general, for a certain deployment environment, a rack having a larger opening will produce less restriction to airflow than a rack having a smaller opening. Further, various rack configurations for a given nominal rack opening width can have an impact on air flow. For example, racks having the same opening dimensions may be configured to meet different standards, such as the Electronic Industries Alliance (EIA) standard or the Seismic Unequal Flange Equipment Rack (SUFER) standard. In the latter case, the SUFER rack will be more restrictive to air flow than an EIA rack.

In addition to physical differences between racks and cabinets, the environment in which racks and cabinets (and the chassis therein) are employed typically differ as well. For example, cabinets are often deployed in data centers, while racks are often deployed in telecommunication offices. Different industry standards apply to environmental requirements for the various environments in which the chassis will operate.

Ambient temperature operational guidelines differ based on the operating environment for the chassis. For example, in a telecommunications office, Telcordia General Requirements Document Number 63 specifies a long and short term operational ambient temperature of 50 C and 40 C respectively. A data center environment conforming to Telcordia General Requirements Document Number 3160 accounts for a more restrictive deployment for chassis or cabinets and compensates with 10 C margin and defines the long term operational temperature of 30 C. Such temperatures represent the maximum temperature at the inlet to the chassis cooling system. Data centers are generally more thermally controlled compared to telecommunication offices. As such, equipment in data centers is not expected to operate at more extreme temperatures than those that may occur in telecommunication offices. Some equipment, like computer servers, is specifically intended for cabinet deployment in data centers and operates using front-to-rear forced cooling air flow. However, some telecommunications equipment is primarily intended for rack deployment in telecommunication offices and operate using side-to-side forced cooling air flow. When such telecommunications equipment is deployed in closed-sided data center cabinets having narrower widths than telecommunication racks, venting and thermal regulation can be more challenging than for rack deployment in telecommunication offices. For example, even though the threshold ambient temperatures are lower for data center environments, as a result of the closed construction of cabinets used to house chassis in data centers, the data center operating environment is considered to be more thermally challenging than that of the telecommunications office owing to airflow restrictions caused by the cabinets.

Also, with regard to acoustic level limits, Telcordia General Requirements Document Numbers 63 and 3160 define the acoustic emission of a product to be limited to 78 dBA for both the telecommunications office and the data center respectively. However, the same chassis and fan module combination will likely produce different sound volume levels when installed in a rack versus a cabinet.

Accordingly, it can be useful to provide a chassis deployed in an operating environment and constructed to take into account the operating environment, mounting configuration, and the number of chassis in the deployment. Furthermore, a system may consist of only one chassis, in which case each chassis has a higher acoustic emission limit.

One solution to complying with the varying thermal and acoustic requirements for the different operating environments that a chassis may encounter is to manufacture different chassis tailored to different operating environments. For example, a chassis has been manufactured which can receive differently constructed fan modules, each of which being constructed for a specific operating environment. However, producing assembled chassis with fan modules pre-installed based on the intended operating environment of the chassis, requires the manufacture of different fan modules to cover the gamut of various chassis configurations. Such a technique is costly.

Another approach to addressing chassis compliance with different operating environments has been to use software to configure the chassis and its component modules for their operating environments. The software is configured by the end user. However, such configurations, in some cases, may require the participation of the end user to deploy, manage, and update the software. Moreover, such configurations also may necessitate software support for older, legacy hardware, which can be costly.

Yet another approach is to operate the fans in such a way that risks violating the thermal or acoustic requirements discussed above. For example, the fans may be operated at their maximum speeds at all times, thereby possibly violating acoustic requirements. Operating continuously at full speed, however, will make power consumption significantly higher. There is a cubed law relationship between RPM percentage and power. For example, running fans at 70% maximum RPM consumes only 35% of the power compared to maximum. (0.7*0.7*0.7=0.34) Also, the fans can be operated at slower speeds all the time, but thereby risk not meeting thermal requirements for the chassis.

SUMMARY

The above and other limitations are overcome by a procedure, and by an apparatus, system and computer program that operate in accordance with the procedure, for operating a fan module.

A system, apparatus, and method are described herein which use a profile switch to set one operating profile out of a plurality of selectable operating profiles associated with the operating environment of a fan module controlled based on the set operating profile.

In accordance with one example embodiment herein, a system includes a chassis having a backplane, at least one fan module arranged in the chassis, and a profile switch. Each fan module includes at least one fan and a fan module controller arranged to receive a control signal from a shelf controller. The profile switch is arranged to signal the fan module controller so as to control the at least one fan based on operating profiles corresponding to selected switch positions of the switch.

In accordance with another example embodiment herein, a fan module includes at least one fan and a fan module controller arranged to control the at least one fan based at least on an external control signal applied to the fan module controller.

In accordance with yet another example embodiment herein, a procedure of controlling a fan module includes setting a switch position of a profile switch which is coupled to at least one fan module, obtaining a fan module controller fan state from a shelf controller, and determining an autonomous state of the fan module controller. Also, the procedure includes setting the fan speed to a normal speed defined for the profile if the fan module controller state and the autonomous state are normal and setting the fan speed to a fast speed defined for the profile if the fan module controller state and/or the autonomous state are not normal.

Additional features and benefits of the exemplary embodiments will become apparent from the detailed description, figures and claims set forth below.

BRIEF DESCRIPTION OF THE DRAWINGS

The teachings claimed and/or described herein are further described in terms of exemplary embodiments. These exemplary embodiments are described in detail with reference to the drawings. These embodiments are non-limiting exemplary embodiments, wherein:

DETAILED DESCRIPTION

Those of ordinary skill in the art will realize in view of this description that the following detailed description of the exemplary embodiments is illustrative only and is not intended to be in any way limiting. Other embodiments will readily suggest themselves to such skilled persons having the benefit of this disclosure. Reference will now be made in detail to implementations of the exemplary embodiments as illustrated in the accompanying drawings. The same reference numbers will be used throughout the drawings and the following detailed description to refer to the same or like parts.

Figure 1:
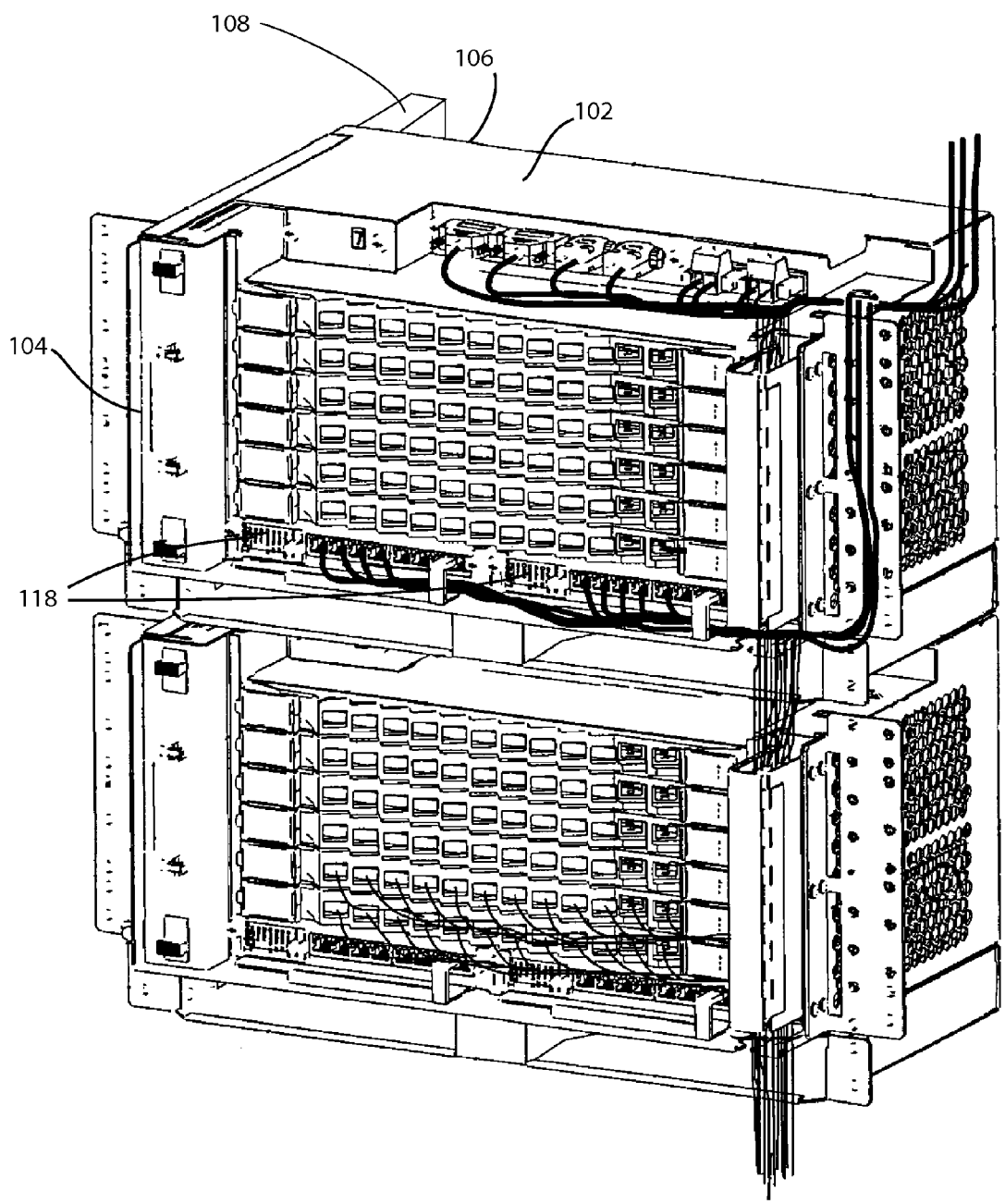
FIG. 1 shows a system comprised of two rack-mounted chassis each having a fan module.

FIG. 1 shows a view of an exemplary embodiment of a chassis 102 shown with a fan module 104 installed in the chassis 102 and connected to a backplane 106 of the chassis 102. One fan module 104 is shown in the embodiment. However, it will be appreciated that in other embodiments, one or more fan modules 104 may be present in the chassis 102. In one embodiment the fan module 104 has visual indicators, such as LEDs, to indicate a fan profile setting. For example, if 4 profiles are defined, 2 LEDs may be used. The chassis 102 may be arranged like chassis 1800 shown in FIG. 1 of U.S. patent application Ser. No. 12/036,029, filed Feb. 22, 2008, the entire contents of which are incorporated herein by reference. Also shown in FIG. 1 is a profile switch 108 connected to the backplane 106 of the chassis 102. The backplane 106 connects the fan module 104 to the profile switch 108. In one embodiment, the backplane 106 has a connector 114a, shown schematically in FIG. 2, which mates with or otherwise plugs into a connector 114b, shown schematically in FIG. 2) on the rear of the fan module 104. In the example embodiment shown in FIG. 1, two shelf controllers 118 are also installed in the chassis 102. In at least one other embodiment, the fan module 104 exists in a fan tray (not shown) which is separate from the chassis 102. Thus, in at least one embodiment, the fan module 104 may not be located in the chassis 102 with the shelf controller 118.

Figure 2:
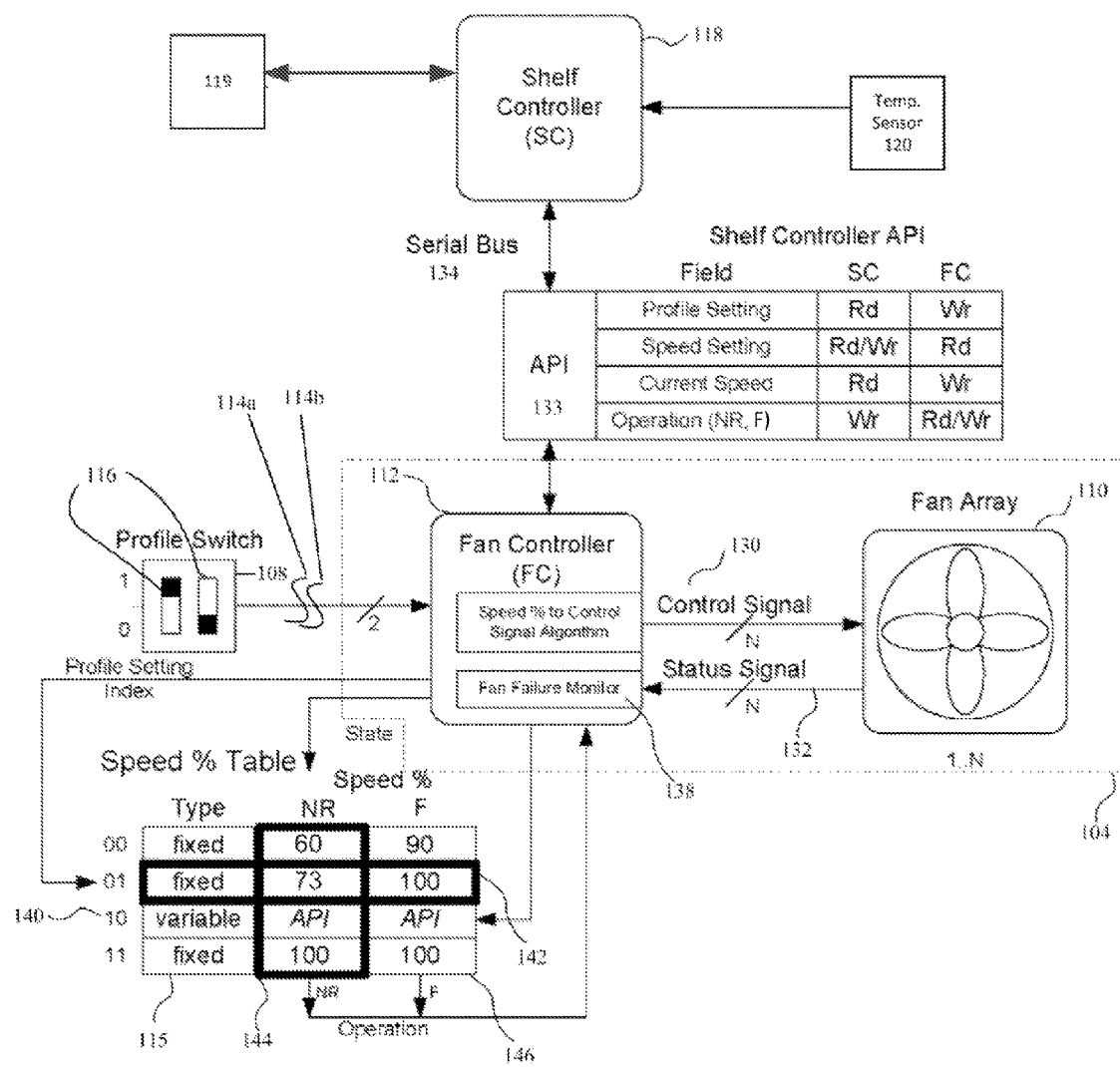
FIG. 2 is a schematic of a control arrangement in accordance with an example aspect herein.

FIG. 2 shows schematically a portion of chassis 102, including the fan module 104, shelf controller 118, and profile switch 108 of FIG. 1. In one embodiment, shelf controller 118 includes at least one processor. As shown in FIG. 2, shelf controller 118 is connected to a memory 119, which is shown as separated from shelf controller 118. However, in other embodiments, memory 119 can be integrated with shelf controller 118, such that in at least one embodiment the shelf controller 118 includes both a memory and a processor. In the example shown in FIG. 2, the fan module 104 includes fan array 110 which is connected to a fan module controller 112. In one embodiment, the fan module controller 112 is constructed as a field programmable gate array (FPGA) which employs control logic to perform control procedures discussed herein to control the speed of fans of the fan array 110. Shelf controller 118 is connected to the fan module controller 112 through the backplane 106 (FIG. 1) and through serial bus 134. The shelf controller 118 optionally is connected to a sensor 120, such as a temperature sensor. The fan module controller 112 is further connected, through the connectors 114a and 114b at the backplane 106 (FIG. 1), to the profile switch 108, which has two binary switches 116. Each of the switches 116 can be set in one of two positions providing a total of four possible switch setting combinations for the two switches 116. The four switch setting combinations for switches 116 are shown in the column headed "Switch Settings" in the table labeled "Speed % Table" 140 in FIG. 2. The table 140 can be stored in a memory 115. In another embodiment controller 112 can be constructed as an FPGA or CPLD which can implement the table 140 as a discrete logic that need not be separate from controller 112. As shown in table 140, the switch setting combinations for switches 116 are (0,0), (0,1), (1,0), and (1,1). Each switch setting combination is associated with one fan profile defined in one of the rows of table 140. For example, as shown in FIG. 2, switches 116 are set to (0,1) corresponding to the profile defined by row 142 of table 140.

The profile switch 108 is shown in the embodiment of FIG. 1 extending from backplane 106. Such an arrangement may facilitate the replacement of fan module 104 with another fan module (such as, for example, if fan module 104 failed) without having to configure the replacement fan module with the settings of profile switch 108. In this manner, the fan module 104 and any replacement fan modules "inherit" the same settings of profile switch 108 merely by being connected to the switch 108 through the backplane 106. In another embodiment, the profile switch 108 is integrated into fan module 104. However, for such an arrangement, if the fan module 104 is replaced, an installer may be required to properly configure the profile switch settings of the replacement fan module before use in chassis 102.

In one embodiment, the shelf controller 118, memory 119, and sensor 120 are physically located remote from the fan module 104, and in another embodiment, the shelf controller 118 and sensor 120 may be incorporated into the backplane 106 or other part of chassis 102. In yet another embodiment, the shelf controller 118, memory 119, and sensor 120 are physically located in fan module 104.

In one embodiment, the shelf controller 118 is constructed to execute a procedure for determining a fan module state, as described herein. The shelf controller 118 also is constructed to communicate with the fan module controller 112 using an application programming interface (API) 133, which includes various fields to which the shelf controller (SC) 118 and fan module controller (FC) 112 can read (Rd) values from and/or write (Wr) values into.

The fan array 110 includes one or more fans (not shown) that are constructed for variable speed operation. The fan module controller 112 can control the speed of the fans 110 using pulse width modulation (PWM) control logic, for example, which may control the fans 110 to between, for example, 20 and 100 percent of their full rated speed. In one embodiment, fan module controller 112 has control logic for converting speed (PWM %) values into a control signal 130 sent to the fan array 110. The fan array 110 is constructed to send a status signal 132 (also termed a "TAC" signal) to the fan module controller 112. The status signal 132 can be used by the fan module controller 112 to determine if one or more of the fans of the array 110 have failed as discussed further below.

Each row of table 140 defines a fan profile by a profile type, a "normal" (NR) fan speed, and a "fast" (F) fan speed. In another embodiment, the profile could have additional speeds defined, such as, for example, slow, medium, and fast. The normal and fast fan speeds correspond to fan speed settings for the fans of fan array 110. The values of the fan speeds are specified in table 140 as a pulse width modulation (PWM) output percentage. In one embodiment, the profile types include a fixed type and a variable type. A fixed profile type refers to a profile where the normal and fast fan speeds are predetermined A variable type refers to a profile where the normal and fast fan speeds are not predetermined, but instead are determined by shelf controller 118, as described further below. For example, shelf controller 118 may have control logic based on an algorithm to determine the normal and fast fan speeds based on a temperature sensed by sensor 120.

The fan profiles shown in table 140 may correspond to a particular deployment environment of the chassis, as indicated further in Table 1 below, which includes additional information from that shown in table 140 of FIG. 2. Table 1 includes example fan speed values (in revolutions per minute, RPM) associated with the normal and fast PWM values noted in table 140.

TABLE 1

| | | | Fan Module Status | | | |
|---|---|---|---|---|---|---|
| Deployment Environment (Profile) | Profile Type | Profile Switch Setting | Normal (RPM) | PWM Output (%) | Fast (RPM) | PWM Output (%) |
| Telecommunications | Fixed | 0, 0 | 10,000 | 60 | 15,000 | 90 |
| Data Center | Fixed | 0, 1 | 12,500 | 73 | 17,000 | 100 |
| Software Defined | Variable | 1, 0 | N/A | N/A | N/A | N/A |
| Fast | Fixed | 1, 1 | 17,000 | 100 | 17,000 | 100 |

For example, one of the deployment environments is named "Telecommunications", which corresponds to a fan profile suitable for when the chassis is deployed in a telecommunications office, which has its own thermal and acoustic environmental standards as noted above. When the telecommunications profile is set by switch 108, the corresponding fixed RPM and PWM output % values listed in Table 1 are used to determine an output value of the speed of the fans in fan array 110, as noted hereinbelow.

Also, for example, another one of the deployment environments in Table 1 is named "Data Center", which corresponds to a fan profile suitable for when the chassis is deployed in a data center, which has its own thermal and acoustic environmental standards as noted above. When the data center profile is set by switch 108, the corresponding fixed RPM and PWM output % values listed in Table 1 are used to determine the output value of the speed of the fans in the fan array 110, as noted hereinbelow.

Another deployment environment listed in Table 1 is named "Software Defined", which corresponds to a variable type fan profile. When the profile corresponding to the software defined deployment environment is set by switch 108, the RPM and PWM output % values for NR and F are determined based on control logic of shelf controller 118 as discussed further below.

Another deployment environment listed in Table 1 is named "Fast" (F), which corresponds to a fixed type profile. When the profile corresponding to the fast deployment environment is set by switch 108, the corresponding fixed RPM and PWM output % values listed in Table 1 are used to control the speed of the fans in the fan array 110, as noted hereinbelow. As shown in the example of Table 1, for the fast profile, the fan speeds listed are 100% for both normal and fast. If the fast profile is selected at the profile switch 108, all of the fans 110 will be operated at the same speed defined in Table 1 regardless of the fan module state. Such a setting may be desirable for field service and troubleshooting purposes. While the "fast" profile is described having constant fan speed of 100%, it will be appreciated that in other embodiments, any constant fan speed less than 100% can also be defined.

As shown in the example of API 133 in FIG. 2, the shelf controller (SC) 118 can read the profile setting (i.e., switch setting) and the fan module controller (FC) 104 can write the value of the profile setting. The shelf controller 118 can read and write the fan speed setting values and the fan module controller 112 can read the fan speed setting values. The shelf controller 118 can read the current speed (i.e., status signal 132) and the fan module controller 112 can write the current speed. The field "operation (NR, F)" designates which set of speed values are used, as described further hereinbelow. The shelf controller 118 can write the operation value and the fan module controller 104 can read and write the operation value.

As described above, in the example shown in FIG. 2, the profile switch 108 can be set for one of four profile settings, which are selectable by an installer, such as when the chassis 102 is installed in its operating environment. For example, if the chassis 102 is installed in a cabinet in a data center, an installer can set the profile switch 108 to a "Data Center" profile. By selecting Data Center, the fan module controller 112 will be able to set the speed of the fans 110 based on a fan module state determined by the shelf controller 118, as described further hereinbelow. When the chassis 102 is in service, the profile switch 108 is preferably physically covered to limit further access to changing the settings of the switch 108.

The fan module controller 112 obtains the fan module state signal (the "operation NR or F" field of API 133 in FIG. 2) from the shelf controller 118 via API 133. The state of the fan module 104 may be "normal" or "fast", as shown in the column headings in Table 1 above and table 140 in FIG. 2. In one example, the state of the fan module 104 may be based on the ambient air temperature sensed by a sensor 120 in communication with the shelf controller 118. For example, in one embodiment the shelf controller 118 is connected to the temperature sensor 120, which is arranged to sense the temperature of ambient air entering the chassis 102. In this example embodiment the shelf controller 118 determines whether the sensed temperature is equal to or above a predetermined threshold temperature or is below the predetermined threshold temperature. If the sensed ambient temperature is determined to be below the predefined threshold temperature, for example, the shelf controller 118 may send a signal to the fan module controller 112 instructing the fan module controller 112 to set the fan module state to "normal". However, if the sensed ambient temperature is determined to be equal to or above the threshold temperature, the shelf controller 118 may send a signal to the fan module controller 112 instructing fan module controller 112 to set the state of fan module 104 to fast.

The fan module controller 112 is constructed to set the operational speed of the fans 110 based on the setting of fan profile switch 108 and its current state. For example, when the profile switch 108 setting is set to a particular profile and when the shelf controller 118 sets the state of the fan module 104 to be "normal", as described above, the fan module 104 controller 112 controls the fans 110 in accordance with the normal fan speed listed in Table 1 and table 140 (FIG. 2) corresponding to the set profile. Alternatively, when the shelf controller 118 sets the state of the fan module 104 to be fast, the fan module controller 112 controls the fans of the fan array 110 in accordance with the fast speed listed in Table 1 and table 140 (FIG. 2).

When a software defined profile is selected at the profile switch 108, the shelf controller 118 can set the speed setting using API 133. For example, in one embodiment, when the profile switch 108 is set to the "software defined" profile, the shelf controller 118 determines the fan speed setting in accordance with an algorithm defined by control logic stored in memory 119 and executed by the processor of controller 118. The speed % values are made available to the fan module controller 112 to read through API 133. The fan module controller 112 can then output a PWM control signal 130 based on the determined speed corresponding to the fan module state determined by the shelf controller 118.

The software defined (variable type) profile, in at least some cases, may permit more control flexibility than afforded by implementing the other (fixed) profile settings listed in Table 1. When the software defined profile is set, the shelf controller 118 can implement a more complex algorithm based on ambient temperature and/or component temperature to exert finer control over fan speed. For example, instead of the two fan speeds (normal and fast) defined in each of the predefined profiles, for the software defined (variable) profile the shelf controller 118 can be programmed with a more complex functional relationship so that the fan speed can be more finely controlled based on a sensed parameter, such as one or more of internal chassis temperature, and component temperatures and their published operating temperature limits.

Also, the fan module controller 112 is capable of autonomous operation wherein the fan module controller 112 can determine an autonomous state of the fan module 104 and write the determined state information to the API 133. As shown in FIG. 2, the fan module controller 112 includes a fan failure monitor 138 that autonomously controls the speed of the fans 110 based on a detection of a fan failure based on the status signal 132. For example, where the status signal 132 from the fan array 110 corresponds to a speed below a predetermined threshold, it is possible for the fan failure monitor 138 to determine that a failure of at least one fan has occurred in the fan array 110. If a failure is determined, then the fan module controller 112 can autonomously control the fan module 104 regardless of the state of the fan module 104 determined by the shelf controller 108.

In one embodiment, the fan module controller 112 monitors the status signal 132 and determines, based on the threshold, whether or not the fan array 110 is operating "normally", in which case the autonomous state of the fan module 104 is determined to be normal. If the autonomous state of the fan module 104 is determined to not be normal based on the status signal 132, then the autonomous state is fast. Moreover, even if the shelf controller 118 determines that the state of the fan module 104 is normal, if the fan module controller 112 determines that the autonomous state of the fan module 104 is not normal, the fan module controller 112, in one embodiment, will autonomously control the fan array 110 based upon the fast speeds defined for the set profile regardless of any other prior setting before the failure was determined.

Figure 3:
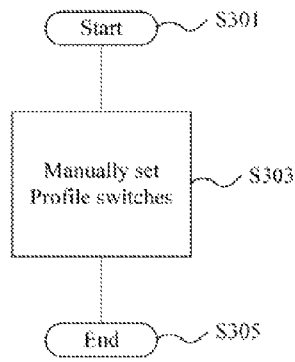
FIG. 3 is a flow chart illustrating a procedure for setting a fan profile in accordance with an example aspect herein.

FIG. 3 shows an exemplary procedure for setting the fan profile. At S301 the procedure begins and at S303 the binary switches 116 are manually set corresponding to a desired profile, which may correspond to a chassis deployment environment listed in Table 1 (e.g., telecommunications and data center). However, for troubleshooting purposes, for example, a technician can change the setting of the switch 108 to a setting that is not based on the chassis installation environment. At S305 the procedure ends. With the switch 108 set, the switch 108 can be covered to prevent further alteration of the switch 108 settings.

Figure 4:
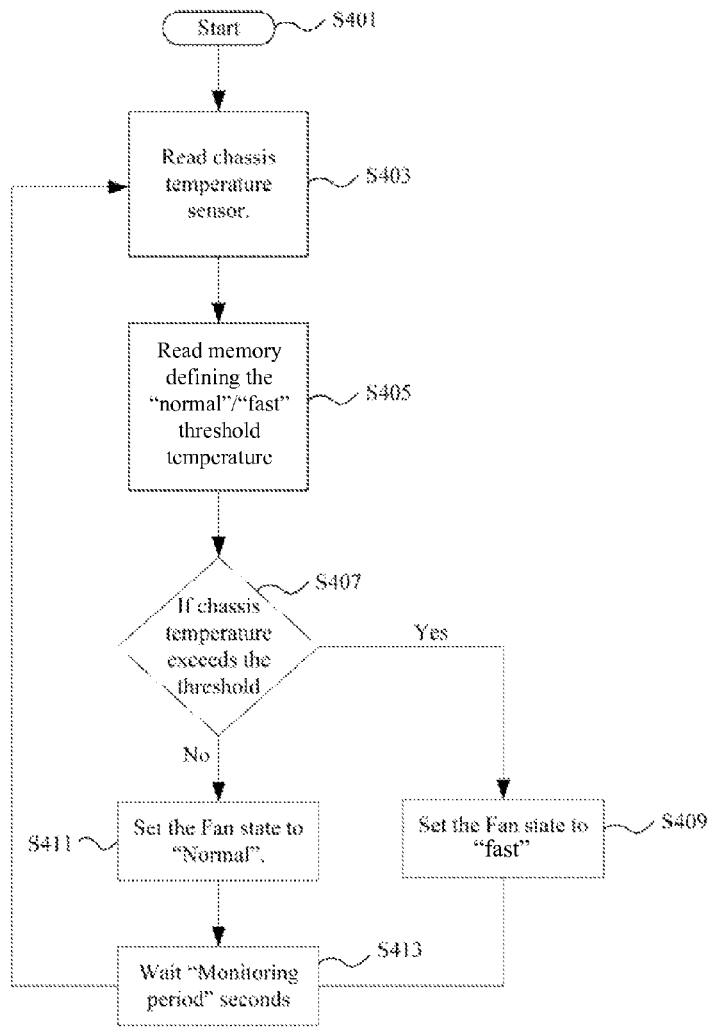
FIG. 4 is a flow chart illustrating a procedure for setting a fan module controller state in accordance with an example aspect herein.

FIG. 4 shows an exemplary procedure of setting the state of the fan module 104 by the shelf controller 118. In one embodiment, the shelf controller 118 is constructed to perform the procedure of FIG. 4. At S401 the procedure begins and at S403 the shelf controller 118 reads the temperature sensor 120. At S405 memory 119, which stores temperature data corresponding to fan profiles, is read to obtain a threshold temperature defined for the profile set, such as in FIG. 3. It is determined at S407 whether or not the sensed temperature exceeds the threshold. If it is determined that the sensed temperature exceeds the threshold (i.e., YES at S407), then the fan module state is set to "fast" at S409. If it is determined that the sensed temperature does not exceed the read threshold (i.e., NO at S407), then the fan module state is set to "normal" at S411. In either case, after S411 or S409, control passes to S413 where there is a delay of a predefined "monitoring period" (e.g., a few seconds), after which the procedure returns to S403.

Figures 5, 6:
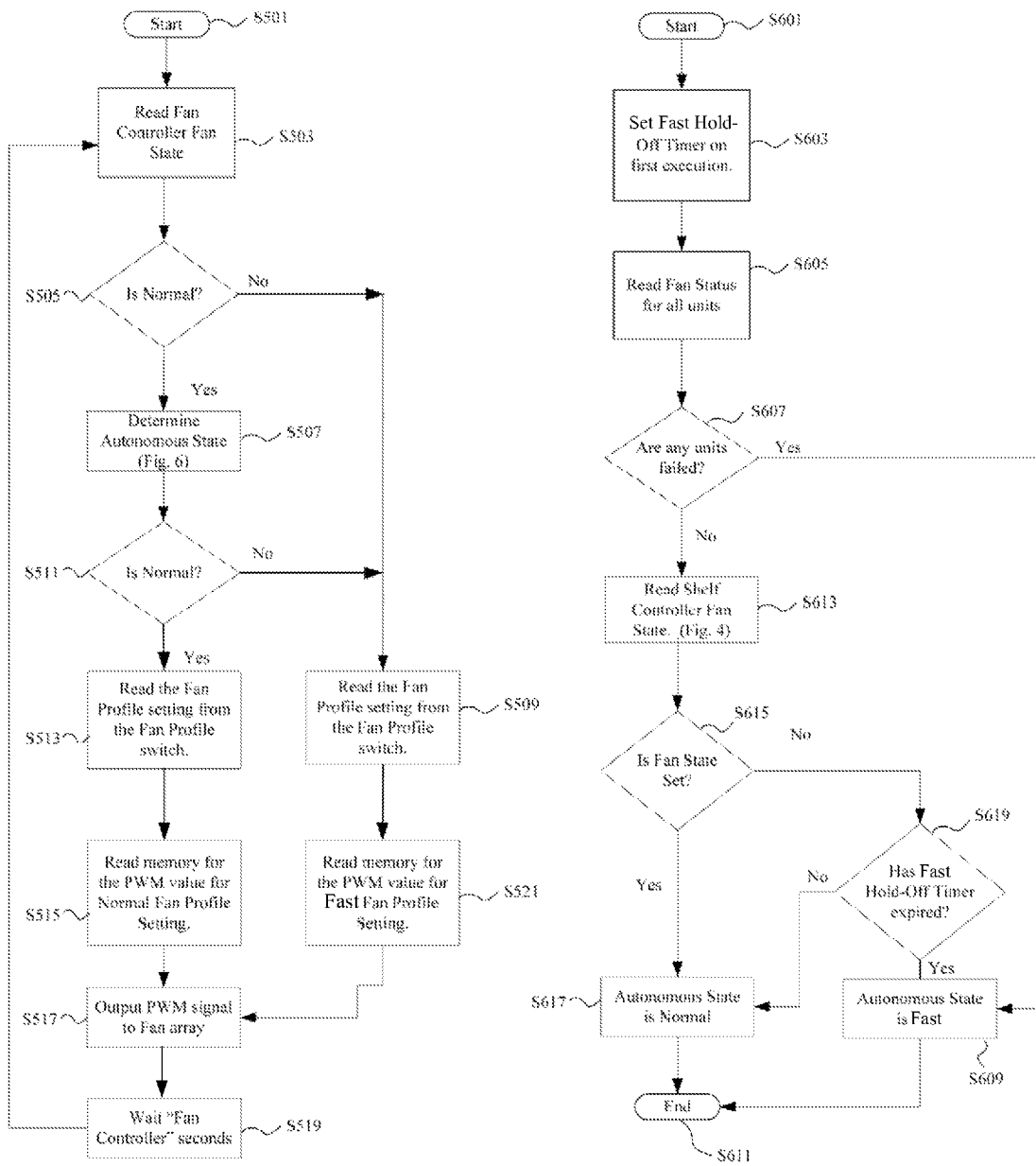
FIG. 5 is a flow chart illustrating a procedure for setting fan speed in accordance with an example aspect herein.
FIG. 6 is a flow chart illustrating a procedure for setting an autonomous state of a fan module controller in accordance with an example aspect herein.

FIG. 5 shows an exemplary procedure of setting the fan speed by the fan module controller 112. In one embodiment, the fan module controller 112, constructed as a field programmable gate array (FPGA) or complex programmable logic device (CPLD), is constructed to perform the procedure using digital logic. Alternatively, the procedure may be defined, at least in part, by program instructions stored in a memory, such as memory 115 and/or memory 119, which instructions can be accessed and executed by a controller, such as controllers 112 and/or 118, for affecting the procedure.

Initially at S501, the procedure begins and at S503 the fan module controller 112 reads the state of fan module 104, determined in the procedure of FIG. 4 (e.g., the result of S409 or S411), from API 133. At S505 the fan module controller 112 determines whether or not the read state is normal. If it is determined that the state of fan module 104 is normal (i.e., YES at S505), then an autonomous state of the fan module 104 is determined at S507, in accordance with a procedure described herein with reference to FIG. 6. If it is determined that the read state is not normal (i.e., NO at S505), then at S509 the fan profile setting is determined based on the setting of the fan profile switch 108. Control then passes to S521, which will be described below.

S511 is entered after S507 is performed. At S511 it is determined whether or not the determined autonomous state of the fan module 104 determined at S507 is normal. If it is determined that the autonomous state is normal (i.e., YES at S511), then at S513 the fan profile setting is determined based on the setting of the fan profile switch 108. If it is determined that the autonomous state is not normal (i.e., NO at S511), then at S509 the fan profile setting is determined based on the setting of the fan profile switch 108. Control then passes to S521, which will be described below.

Following S513, at S515 memory 115 is read by fan module controller 112 to obtain the "normal" PWM value corresponding to the set fan profile. For example, in table 140 in FIG. 2, for the profile defined by box 142, the normal (NR) speed of 73% would be read from column 144. At S517 a PWM signal having the read "normal" or "fast" PWM value is output via control signal 130 to the fan array 110. Then the procedure continues to S519. At S519 a waiting period elapses for a predefined "fan controller seconds". At the end of the waiting period in S519, the procedure returns to S503, whereupon the state of fan module 104 is read again and the procedure then continues as described above.

The procedure at S521 will now be described. Following S509, at S521 memory 115 is read for the fast fan speed value corresponding to the set fan profile. For example, in table 140 in FIG. 2, for the profile defined by box 142, the fast speed of 100% would be read from column 146. The procedure then continues as described above at S517.

As a result of the procedure of FIG. 5, a speed setting is obtained and output to the fan array 110 with control signal 130. The speed setting sent to the fan array 110 is the normal or fast speed value in Table 1 or Table 140 in FIG. 2 corresponding to the profile set by the profile switch 108 and the fan(s) of the fan array 110 are operated at this speed.

FIG. 6 shows an exemplary sub-procedure for determining the autonomous state discussed at S507 in FIG. 5. At S601 the procedure begins and at S603 a "fast hold-off" timer is set by fan module controller 112 on startup of the fan module 104. At S605 fan status signal 132 of all fans in the array 110 is read by fan module controller 112. At S607 it is determined by fan failure monitor 138 of fan controller 112 based on signal 132, whether any of the fans in the array 110 have failed. For example, some fans may have a TAC signal corresponding to their operational speed that is transmitted to the fan module controller 112 as the status signal 132 shown in FIG. 2. The failure monitor 138 of the fan module controller 112 can monitor the status signal 132, and if it does not transition or is out of predefined frequency limits, the controller 112 can determine that one or more fans in the array 110 have failed. If it is determined that one or more fans in the array have failed (i.e., YES at S607), then the autonomous state of the fan module 104 is set by the fan module controller 112 to fast and then the procedure in FIG. 6 ends at S611. When in the fast state, the control signal 130 includes an output speed setting for all of the fans in the array 110. The fast speed corresponds to the profile set by switch 108.

Setting all of the fans in array 110 that have not failed to the fast speed in S609 is an attempt to safeguard the housed electronic components in the chassis 102 against failure owing to possible insufficient heat removal caused by reduced airflow from one or more failed fans 110. The fans in array 110 that have not failed can therefore be intentionally set to the fast speed to flow as much air through the chassis 102 as possible to offset for the reduced cooling capacity caused by the failed fan(s)

If it is determined that all of the fans in the array have not failed (i.e., NO at S607), then the fan module controller 112 reads API 133 at S613 to determine if the state of the fan module 104 has been set by the shelf controller 118. At S615 it is determined whether or not the fan module state is set, such as according to the procedure shown in FIG. 4. If it is determined that the state of the fan module 104 is set (i.e., YES at S615), then the autonomous state of fan module 104 is set to "normal" at S617 and the procedure then ends at S611 or continues on to S507 in the procedure shown in FIG. 5. If it is determined that the state of fan module 104 is not set (i.e., NO at S615), then a determination is made at S619 as to whether or not the "fast hold-off" timer has expired. If it is determined that the "fast hold-off" timer has expired (i.e., YES at S619), then in S609 the autonomous state of fan module 104 is set to "fast" and the procedure then continues to end at S611 or continues on to S507 in the procedure shown in FIG. 5. If it is determined that the "fast hold-off" timer has not expired (i.e., NO at S619), then the autonomous state of the fan module 104 is set to normal in S617 and the procedure ends at S611 or continues on to S507 in the procedure shown FIG. 5. Thus, the autonomous state of the fan module 104 is set to normal in S617 or fast (not normal) in S609 and such information in either case can be used in S507 of the procedure shown in FIG. 5 to set the speed of the fans in array 110.

The system, apparatus, and procedures described herein in one example permit one or more fan modules to be constructed which can be used in a chassis deployed in multiple deployment environments, which provides functionality that a chassis constructed with a conventional fan module may not already have. The deployment environment is configured when the chassis is installed and an operating fan module profile is set corresponding to the deployment environment by setting hardware switch 108. Moreover, because in one example the fan profiles are configured through hardware switch 108, the fan modules 104 can be adapted to operate in future or legacy deployment environments without accounting for interactions with existing software, such as EMS software, or later developed software.

While particular example embodiments have been shown and described, it will be obvious to those of skills in the art that based upon the teachings herein, changes and modifications may be made to the example embodiments without departing from these embodiments and their broader aspects. Therefore, the appended claims are intended to encompass within their scope all such changes and modifications as are within the true spirit and scope of the exemplary embodiments.

What is claimed is:

1. A system comprising: a chassis having a backplane;
    at least one fan module arranged in the chassis, each fan module including at least one fan and a fan module controller arranged to receive a control signal from a shelf controller; and
    a profile switch arranged to signal the fan module controller so as to control the at least one fan based on operating profiles corresponding to selected switch positions of the profile switch, each operating profile being defined based on a deployment environment of the at least one fan module, the deployment environment being external to the system,
    the operating profiles including at least one fixed type profile and at least one variable type profile, the at least one fixed type profile defining at least two fan speeds that are predetermined and individually selectable based on temperature, the at least one variable type profile defining an algorithm that determines a non-predetermined fan speed based on temperature,
    wherein the fan module controller determines at least one of whether a state of the at least one fan is a failure state and whether a timer has expired, and wherein, in a case where the fan module controller determines that the state of the at least one fan is a failure state or that the timer has expired, the fan module controller controls the at least one fan so that it operates at a predetermined one of the fan speeds.

2. The system of claim 1, wherein the at least one variable type profile is a software-defined profile, and when the switch position is selected that corresponds to the software defined profile, the control signal specifies a fan speed specified by the shelf controller, based on the algorithm.

3. The system according to claim 1, wherein the variable type profile is a software defined profile and the fixed type profile is a hardware defined profile.

4. The system according to claim 1, wherein the control signal specifies an operational state of the fan module.

5. The system of claim 4, wherein the fan module controller sets a speed of the at least one fan in accordance with a speed defined by at least one corresponding operating profile and the operational state specified by the control signal.

6. The system according to claim 4, wherein the at least one operational state is associated with one or more environmental factors determined by the shelf controller.

7. The system of claim 6, wherein each operating profile defines at least one operational state and a fan speed corresponding to each operational state.

8. A fan module included in a system comprising a profile switch, the fan module comprising:
    at least one fan; and
    a fan module controller arranged to control the at least one fan based at least on an external control signal applied to the fan module controller,
    wherein the external control signal is applied to the fan module controller so as to control the at least one fan based on operating profiles corresponding to selected switch positions of the profile switch,
    the operating profiles including at least one fixed type profile and at least one variable type profile, the at least one fixed type profile defining at least two fan speeds that are predetermined and individually selectable based on temperature, the at least one variable type profile defining an algorithm that determines a non-predetermined fan speed based on temperature,
    wherein the fan module controller determines at least one of whether a state of the at least one fan is a failure state and whether a timer has expired, and wherein, in a case where the fan module controller determines that the state of the at least one fan is a failure state or that the timer has expired, the fan module controller controls the at least one fan so that it operates at a predetermined one of the fan speeds.

9. The fan module of claim 8, wherein the fan module controller outputs information specifying a speed of the at least one fan.

10. The fan module of claim 8, wherein the external control signal is applied from a shelf controller of a first chassis that is constructed to receive the fan module or a second chassis separate from the fan module.

11. The fan module of claim 10, wherein at least one fan speed setting is specified by the external control signal from the shelf controller.

12. The fan module of claim 10, wherein the fan module controller sets a fan speed of the at least one fan based, at least in part, on the operating profile set by the profile switch.

13. The fan module of claim 12, wherein the profile is defined by at least one state of the fan module and a fan speed corresponding to each state of the fan module.

14. The fan module of claim 13, wherein the state is specified by the external control signal from the shelf controller or is autonomously specified by the fan module controller.

15. The fan module of claim 8, wherein the profile switch includes at least two switches, and each of the at least two switches is settable in one of plural positions.

16. The fan module of claim 8, wherein the at least one fan includes a plurality of fans, and wherein, in the case where the fan module controller determines that the state of the at least one fan is the failure state or that the timer has expired, the fan module controller controls all of the plurality of fans so as to operate at the predetermined one of the fan speeds.

17. A procedure of controlling a fan module, the method comprising:
    setting an operating profile by setting a switch position of a profile switch which is coupled to at least one fan module included in a system, each operating profile being defined based on a deployment environment of the at least one fan module, the deployment environment being external to the system;

determining at least one of an autonomous state of a fan module controller and whether a timer has expired; and setting a fan speed to a normal speed defined for the operating profile if the autonomous state is normal and setting a fan speed to a fast speed defined for the operating profile if the autonomous state is not normal or the timer has expired, each operating profile including at least one of a fixed type profile or at least one variable type profile, the at least one fixed type profile defining at least two fan speeds that are predetermined and individually selectable based on temperature, the at least one variable type profile defining an algorithm that determines a non-predetermined fan speed based on temperature.

18. The procedure of claim 17, wherein if the operating profile is the at least one variable type profile, activating an interface between the fan module controller of the fan module and the shelf controller, wherein the fan speed is received by the fan module controller.

19. The procedure of claim 17, wherein the fan module controller state is based at least on an environmental factor in the chassis.

20. The procedure of claim 17, wherein the switch position corresponds to an operating profile that defines fan speed operational points for a given state of a fan module housed in a chassis.

21. A procedure of controlling a fan module, the method comprising:

setting a switch position of a profile switch which is coupled to at least one fan module;

obtaining a fan module controller fan state from a shelf controller;

determining an autonomous state of the fan module controller; and setting a fan speed to a normal speed defined for the profile switch if the fan module controller state and the autonomous state of the fan module controller are normal and setting the fan speed to a fast speed defined for the profile if the fan module controller state and/or the autonomous state of the fan module controller are not normal, wherein the autonomous state of the fan module controller is based at least on one of a failure status of fans in the fan module, the fan module controller fan state, and a hold-off timer expiration.

22. The procedure of claim 21, wherein in a case where any fans of the fan module are determined to have failed, the autonomous state of the fan module controller is set to fast.

23. The procedure of claim 21, wherein in a case where no fans are determined to have failed and the fan module controller fan state has been obtained, the autonomous state of the fan module controller is set to normal.

24. The procedure of claim 21, wherein in a case where no fans are determined to have failed and the fan module controller fan state has not been obtained and there is no hold-off timer expiration, the autonomous state of the fan module controller is set to normal.

25. The procedure of claim 21, wherein in a case where no fans are determined to have failed and the fan module controller fan state has not been obtained and the hold-off timer expiration has occurred, the autonomous state of the fan module controller is set to fast.

* * * * *